United States Patent [19]

Choi et al.

[11] Patent Number: 4,663,191
[45] Date of Patent: May 5, 1987

[54] SALICIDE PROCESS FOR FORMING LOW SHEET RESISTANCE DOPED SILICON JUNCTIONS

[75] Inventors: Kwangwoo Choi, Poughkeepsie, N.Y.; Stanley Roberts, Burlington, Vt.

[73] Assignee: International Business Machines Corporation, Armonk, N.Y.

[21] Appl. No.: 791,241

[22] Filed: Oct. 25, 1985

[51] Int. Cl.$^4$ .................................... H01L 21/24
[52] U.S. Cl. ......................... 427/93; 156/628; 156/656; 156/657; 427/99
[58] Field of Search .......... 427/93, 99; 156/628, 156/656, 657

[56] References Cited

U.S. PATENT DOCUMENTS

| | | | |
|---|---|---|---|
| 4,180,596 | 12/1979 | Crowder | 427/93 |
| 4,332,839 | 6/1982 | Levinstein | 156/656 |
| 4,337,476 | 6/1982 | Fraser | 427/93 |
| 4,389,257 | 6/1983 | Geipel | 427/93 |
| 4,470,189 | 9/1984 | Roberts | 427/93 |
| 4,563,805 | 1/1986 | Scovell | 29/590 |
| 4,567,058 | 1/1986 | Koh | 427/93 |
| 4,609,568 | 9/1986 | Koh | 427/93 |

*Primary Examiner*—John D. Smith
*Attorney, Agent, or Firm*—Sughrue, Mion, Zinn, Macpeak, and Seas

[57] ABSTRACT

A process of forming a patterned silicide layer overlying a processed semiconductor substrate, the substrate having insulator regions and insulator-free regions on an exposed surface thereof, comprising the steps of:

co-depositing silicon and a refractory metal on the exposed surface of the substrate to form a metal rich silicide thereon;

annealing the metal rich silicide such that it reacts with the underlying insulator-free regions to form a reacted silicide without reacting with the underlying insulator regions; and exposing the substrate to a wet etchant which removes the unreacted portions of the metal rich silicide without removing the reacted silicide.

11 Claims, 4 Drawing Figures

SALICIDE PROCESS FOR FORMING LOW SHEET RESISTANCE DOPED SILICON JUNCTIONS

BACKGROUND OF THE INVENTION

The present invention is concerned with providing a layer of certain metal silicides on a substrate; it is particularly advantageous for providing self-aligned metal silicide layers on semiconductor substrates such as doped silicon and doped polycrystalline silicon.

FIELD OF THE INVENTION

The present invention is specifically contemplated as an improvement on the process of U.S. Pat. No. 4,180,596 Crowder et al, which patent is hereby completely incorporated by reference.

Polycrystalline silicon has in recent years been used to a great extent as the interconnection material in integrated circuits. It is stable at high temperatures and silicon dioxide can be chemically vapor deposited or thermally grown thereon.

An undesirable feature of polycrystalline silicon is its relatively high electrical resistance. For the reasons explained in Crowder et al, it would be desirable to decrease the sheet resistance of polycrystalline silicon interconnections in order to gain increased circuit speed.

It has been suggested that various refractory metals such as molybdenum and tungsten could be used in place of polycrystalline silicon. However, these metals oxidize during chemical vapor deposition of silicon dioxide and the resulting oxides are less stable than silicon dioxide, resulting in a reliability problem.

A number of attempts have been made to overcome the above problem including the process of Crowder et al. Crowder et al discusses a number of prior art references, for example, *IBM Technical Disclosure Bulletin*, Vol. 17, No. 6, Nov. 1974, pp. 1831-33; U.S. Pat. No. 3,381,182; French Pat. No. 2,250,198; and *Journal of the Electrochemical Society, Solid-State Science and Technology* "Fabrication and Thermal Stability of W-Si Ohmic Contacts", by V. Kumar, Feb. 1975, pp. 262-69.

Other references of interest include an article in *Proceedings of the 9th Conference on Solid-State Devices, Tokyo* (1977), pp. 37-40 by Mochizuki et al; "Refractory Silicides for Low Resistivity Gates and Interconnects", 1979 *International Electron Devices Meeting*, pp. 454-57 by Murarka; "Properties of Sputtered Tungsten Silicide for MOS Integrated Circuit Applications", *Journal of the Electrochemical Society—Solid-State Science And Technology*, Feb. 1980, pp. 450-54; *IBM Technical Disclosure Bulletin*, Vol. 24, No. 12, May 1982, p. 6282 by Tu; U.S. Pat. No. 4,411,734; and U.S. Pat. No. 4,443,930.

As discussed in the above prior art, a silicide electrode is typically formed by depositing a layer of silicon, depositing a layer of a refractory metal (e.g., tungsten, molybdenum, etc.), and then annealing the two layers such that the silicide (e.g., tungsten silicide) is formed. Crowder improves on this basic process by co-depositing a refractory metal and silicon from separate evaporation sources to form the silicide. This enables a designer to precisely control the composition of the silicide.

In an article by S. Roberts entitled "Salicide Process for Silicide Wiring for CVD", *IBM Technical Disclosure Bulletin*, Vol. 26, No. 8, Jan. 1984, p. 4338, a layer of refractory metal is deposited on a substrate having isolation regions such as semi-recessed silicon oxides. When the structure is annealed, the refractory metal interacts with the underlaying silicon without reacting with the underlying oxide. Subsequently, the unreacted refractory metal on top of the oxide may be removed in a wet etch without removing the formed silicide. The process results in a self-aligned silicide (i.e., "salicide") because an electrode is formed between the recessed oxide areas without the use of a mask.

A problem with the above "salicide" process is that when the refractory metal reacts with the underlaying silicon, an excessive amount of silicon is consumed. As device dimensions decrease, the ability to form so-called "shallow junctions", in which the thickness of the silicon beneath the gate electrode of an FET is minimized, becomes more important.

In a publication entitled "A New Device Interconnect Scheme For Sub-Micron VLSI" by Chen et al, 1984 *International Electron Devices Meeting*, pp. 118-119, it is suggested that a layer of metal can be deposited followed by a layer of silicon such that shallow junctions can be formed in a silicide process. However, this process is not self-aligned, i.e., a masking step is needed to photolithographically define the silicon layer prior to annealing to form the silicide.

SUMMARY OF THE INVENTION

The present invention provides a process of forming a self-aligned silicide ("salicide") by a method which does not consume an excessive amount of the underlaying silicon.

Specifically, a metal rich silicide is formed by co-deposition of a refractory metal and silicon on a substrate. As a consequence, upon annealing to form the desired silicide, only a small amount of silicon is consumed.

The major problem which the present invention solves is that using the etch compositions of the prior art, it has been extremely difficult to remove the unreacted metal rich silicide without simultaneously removing the reacted silicide.

In accordance with the present invention, it has been found that the unreacted metal rich silicide can be removed without removing the reacted silicide with certain combinations of metal-rich silicides and certain wet etchants.

One major object of the present invention is to provide a process of forming a patterned silicide layer overlying a processed semiconductor substrate where unreacted metal rich silicide can be removed without removing reacted silicide, which process is self-aligning, i.e., which does not require a photolithographic removal step.

A further major object of the present invention is to provide extremely shallow source/drain junction depths in semiconductor devices, for example, on the order of about 0.1 to about 0.3 microns or even as low as 0.05 to 0.15 microns.

Yet another object of the present invention is to provide electrical interconnections of low sheet resistance, for example, on the order of under about 5 ohms/sq. in combination with shallow source/drain junction depths as above exemplified.

These and other objects of the present invention will become clearer upon a reading of the following material.

DESCRIPTION OF THE PREFERRED EMBODIMENTS

Figure 1A:
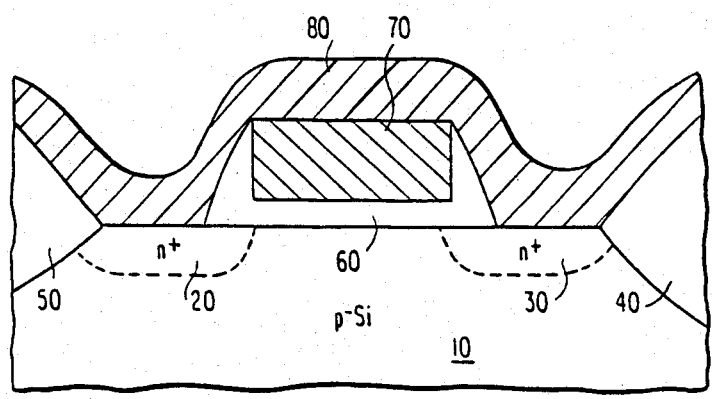
FIGS. 1A and 1B illustrates sequential cross-sectional views of one fabrication scheme for an integrated circuit employing the process of the present invention.

The process of the present invention is applicable to forming films of the desired silicide on any substrate which is capable of withstanding the high temperatures employed in the co-evaporation process and which is adherent to the desired silicide.

The process is particularly advantageous in preparing integrated circuits and is of particular value when the substrate is silicon or polycrystalline silicon and is of most particular value in forming layers which are employed as an overlayer over doped polycrystalline silicon gate electrodes and as an overlayer directly over doped silicon diffused lines.

The general processing conditions of the present invention are firstly discussed and then a detailed discussion of the interrelationship between the metal rich silicides of the present invention and the etchants of the present invention which permit the metal rich silicide to be removed without the reacted silicide being removed will be presented.

It is to be noted that with respect to the general processing conditions of the present invention, i.e., other than the nature of the metal silicides and the etchants used, the conditions of Crowder et al are applied. They are briefly discussed below for purposes of self-containment.

The metal and silicon are typically vaporized under high vacuum and co-deposited on the substrate. The vacuum employed is typically on the order of about $10^{-5}$ to $10^{-6}$ Torr. A preferred method of heating is by electron beam evaporation preferably using separate electron beam guns for the silicon and the metal. The apparatus and conditions for the vacuum evaporation are known and will not be described.

It is preferred that the evaporation rate of the metal be on the order of 0.5 to 2 Angstroms per second, and that of silicon be on the order of 1 to 3 Angstroms per second, respectively, with specific rates being determined by the desired composition of the deposited metal-silicon mixture.

In addition to vacuum evaporation as above described, the metal and silicon can be deposited by a conventional sputtering operation or a conventional chemical vapor deposition operation, the conditions being well known in the art.

The substrate to be coated is usually maintained at a temperature between about room temperature and about 400° C., preferably between about 150° C. and 250° C. during coating.

Metals co-deposited with silicon in accordance with the present invention include titanium, cobalt, nickel, vanadium, tungsten, molybdenum, and we believe, zirconium will also be useful, and the like.

As deposited, the metal/silicon system can be represented by the formula $MSi_x$. With this representation, M represents the metal and Si represents the silicon, "x" representing the atomic proportion of silicon.

Since the object of the present invention is to deposit an alloy, whether deposition is by vacuum evaporation, sputtering or chemical vapor deposition, x must be greater than 0. Normally, we have found that x should be a minimum of about 0.25; if x is less than about 0.25, one approaches the metal and the objects of the present invention are not met.

The maximum value for x will vary depending upon the metal involved.

For example, for titanium, zirconium, tungsten and molybdenum x would be a maximum of 1.0 whereas for cobalt, vanadium and nickel x would be a maximum of about 0.75.

The above values are as-deposited values; after annealing, all metal silicides will be in the reacted silicide form, which can be represented by the formula $MeSi_2$.

Typical as deposited alloys in accordance with the present invention include $Ti_4Si_3$, $TiSi_{1.0}$, $Co_3Si_2$, $V_3Si_2$, $CoSi_{0.75}$ and $WSi_{1.0}$. At present, $TiSi_{1.0}$ and $CoSi_{0.75}$ appear most promising, and $TiSi_{1.0}$ is most preferred.

After the desired amount of metal and silicon are deposited on the substrate, the substrate is removed and subjected to a high temperature heat treatment (annealing). Specifically, the coated substrate is heated in an inert atmosphere or vacuum. The only importance to the atmosphere is to exclude the presence of oxygen. Generally, for the metals titanium, zirconium, cobalt and nickel, a temperature of from about 550° C. to about 750° C. will be used, whereas for vanadium and tungsten a temperature of about 750° C. to about 900° C. will be used in a conventional furnace. If rapid thermal annealing is contemplated where a high intensity arc lamp is used, the upper limit can be lifted approximately 100° C. so that the upper limit of processing most preferably would be about 850° C. or 1,000° C., respectively, for these groups of metals. The maximum temperature generally is selected to avoid excessive grain growth in the silicide.

The time of annealing is not critical so long as the objective of annealing, i.e., complete reaction to the desired silicide, is achieve. Based on our experience to date, it appears that conventional furnace annealing for about one-half hour to about one hour will achieve this result and rapid thermal annealing for about 10 to about 200 seconds also provides the desired result. The time is inversely related to temperature.

The inert atmosphere can be freely selected; examples include argon, helium and hydrogen. The inert atmosphere should be free of substances which cause the formation of carbides, oxides or nitrides of the metal during heating.

If a vacuum is utilized, a pressure of at least $10^{-5}$ Torr is usually sufficient.

If an inert atmosphere is utilized, the objective is to prevent backflow of oxygen into the system (typically from the ambient); as a consequence, if an inert gas is used, the pressure and/or rate of flow is merely sufficient to prevent the backflow. If a vacuum is used, the degree of vacuum is merely sufficient to prevent the presence of oxygen in the system. As a consequence, the pressure of operation is not overly important.

In the situation where an inert atmosphere is used in combination with titanium, normally nitrogen is added, typically in an amount on the order of from about 0.5 to about 5 volume %, to prevent the lateral spread of silicide onto oxide areas.

Following the above procedure, the etching of the present invention is conducted to remove the metal rich silicide without removing the reacted silicide.

After the above removal step, if desired, the coated substrate can be subjected to various conventional procedures as described in Crowder et al.

Following deposition and annealing, the major objective of the present invention is, of course, to remove the metal silicide from areas where the same is not desired but to permit substantially complete retention of the silicide over areas where the same is desired.

It has been discovered, in accordance with the present invention, that wet peroxide etching baths, of a basic or acidic nature, permit this to be achieved.

Wet basic peroxide etchant baths are effective with titanium, zirconium, tungsten and molybdenum silicides; acidic peroxide baths are effective with cobalt, vanadium and nickel silicides.

The wet etchants of the present invention will always comprise an aqueous system which will include water and a source of peroxide. The source of the base or acid can vary.

For basic wet etchants, the pH will normally be about 11 to about 12. At present, the preferred base is ammonium hydroxide; the reason for this is that sodium hydroxide or potassium hydroxide tend to attack oxide present.

For acidic wet etchants, the pH will normally be from about 1 to about 2, i.e., the systems are highly acidic. Both hydrochloric and sulfuric acids are useful, but care should be taken in utilizing nitric acid or hydrofluoric acid since the same will tend to attack oxide present.

The acidic or basic peroxide etchants of the present invention are, as indicated, highly concentrated. For example, excellent results are obtained with a 1:1:1 volume solution of hydrogen peroxide:acid/base:water whereas with a 1:1:2 volume solution of the same components, only a partial etch is obtained.

Thus, it is most preferred that the hydrogen peroxide and acid/base each be used in at least an equal volume amount with respect to added water, preferably greater.

The acids or bases used in the present invention are normally used as saturated solutions in water. The hydrogen peroxide is generally used as available, i.e., a 30% aqueous solution (volume).

The maximum amounts of acid/base or hydrogen peroxide do not appear overly important, but as the amount of water added is increased to dilute the system to an amount much greater than about 1 part by volume added water with 1 part by volume acid/base and 1 part by volume hydrogen peroxide, etching results decrease in acceptability.

Both the basic wet etchants and acidic wet etchants in accordance with the present invention provide a high etch ratio between metal silicide reacted with underlying monocrystalline or polycrystalline silicon and unreacted metal silicide overlying silicon dioxide areas.

The pressure of etching is not overly important; normally we just use ambient pressure, but if one were willing to go to superatmospheric conditions or subatmospheric conditions, we at present see no basic change in processing conditions. Ambient conditions are most convenient.

The temperature of etching should be maintained from about 55° to about 85° C.

The time of etching is not critical since the etching process is autocatalytic, i.e., the rate of etching increases as process time increases. As a general rule, from about 5 to about 10 minutes is sufficient for etching in accordance with the present invention. The time of etching is not meant to be critical nor is it considered limitative on the present invention.

The time of etching will obviously have to be correlated with the thickness of the silicide film involved, with thicker films requiring longer times.

The thickness of the silicide film is set by design requirements. For example, the thickness of the silicide will be determined by the resistivity of the remaining silicide and the amount of silicon which is to be consumed, i.e., the depth of the ultimate junction which is to be obtained.

A typical basic etching solution would comprise equal volume parts of $NH_4OH$—$H_2O_2$ (30 vol %)—$H_2O$, and a typical acidic etching solution would comprise equal volume parts of $HCl$—$H_2O_2$ (30 vol %)—$H_2O$. Both of these solutions are much more concentrated than the 1:1:5 solutions typically used in conventional salicide processes. We have found that these conventional wet etch solutions do not provide favorable results.

In FIG. 1A, a typical p-type silicon substrate is represented by the numeral 10. Implanted therein by any conventional means are n+ source and drain regions 20 and 30, respectively.

$SiO_2$ isolation regions 40 and 50 are shown, the same being formed in a conventional manner. $SiO_2$ region 60 is shown grown on the silicon substrate, again growth being in a conventional manner by chemical vapor deposition or thermal growth with etching of the $SiO_2$ area being performed photolithographically in a conventional manner. Polysilicon gate 70 is also shown in FIG. 1. To this stage, processing is conventional.

After the above conventional procedures, the metal silicide of the present invention is deposited, as illustrated by layer 80. It is to be noted that the metal silicide completely covers $SiO_2$ areas 40 and 50 and polysilicon gate 70 as shown in FIG. 1A.

Following deposition of the metal silicide, annealing in accordance with the present invention is conducted and, following annealing in accordance with the present invention, wet etching is conducted using a basic or acidic aqueous peroxide solution.

Figure 1B:
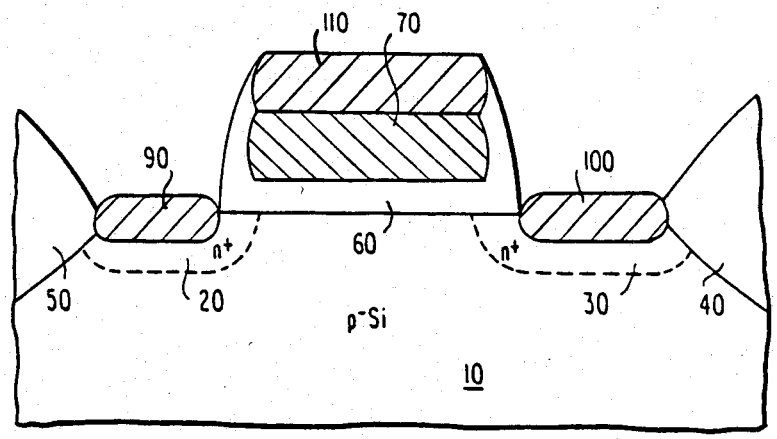

Following annealing and etching, the structure of FIG. 1B results. As can be seen from FIG. 1B, deposited metal silicide over the $SiO_2$ areas 40 and 50 has been removed (since there is no reaction with the silicon oxide thereunder), but metal silicide remains in areas where (in this instance) silicon was available for reaction, specifically, at areas 90 and 100 (overlying the source and drain areas 20 and 30) and over polysilicon gate 70 as shown by remaining metal silicide 110.

In accordance with the present invention, in areas where metal silicide does not react with the underlying silicon oxide, the same is substantially completely removed.

Figure 2:
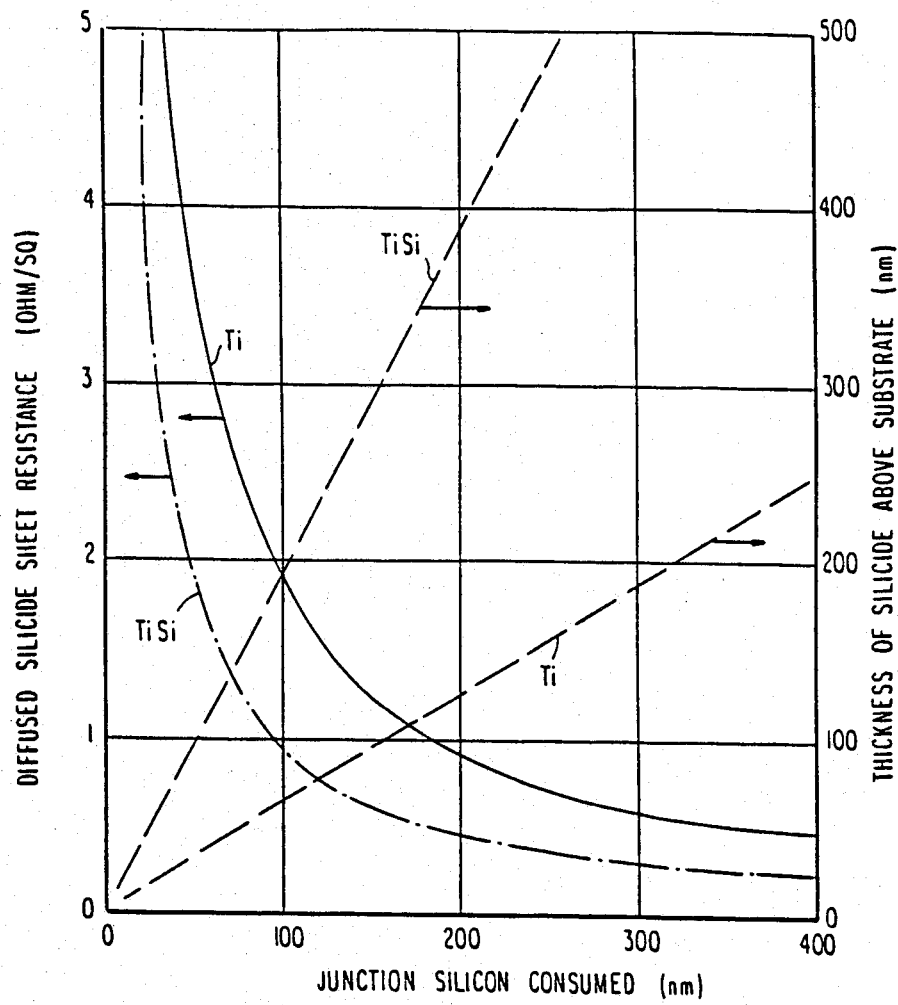
FIGS. 2 and 3 are plots of diffused silicide sheet resistance (ohms/sq.) versus junction silicon consumed (nm) versus thickness of the resulting silicide (nm), for deposited titanium versus deposited metal rich titanium silicide (FIG. 2), and for deposited tungsten versus deposited metal rich tungsten silicide (FIG. 3).
Figure 3:
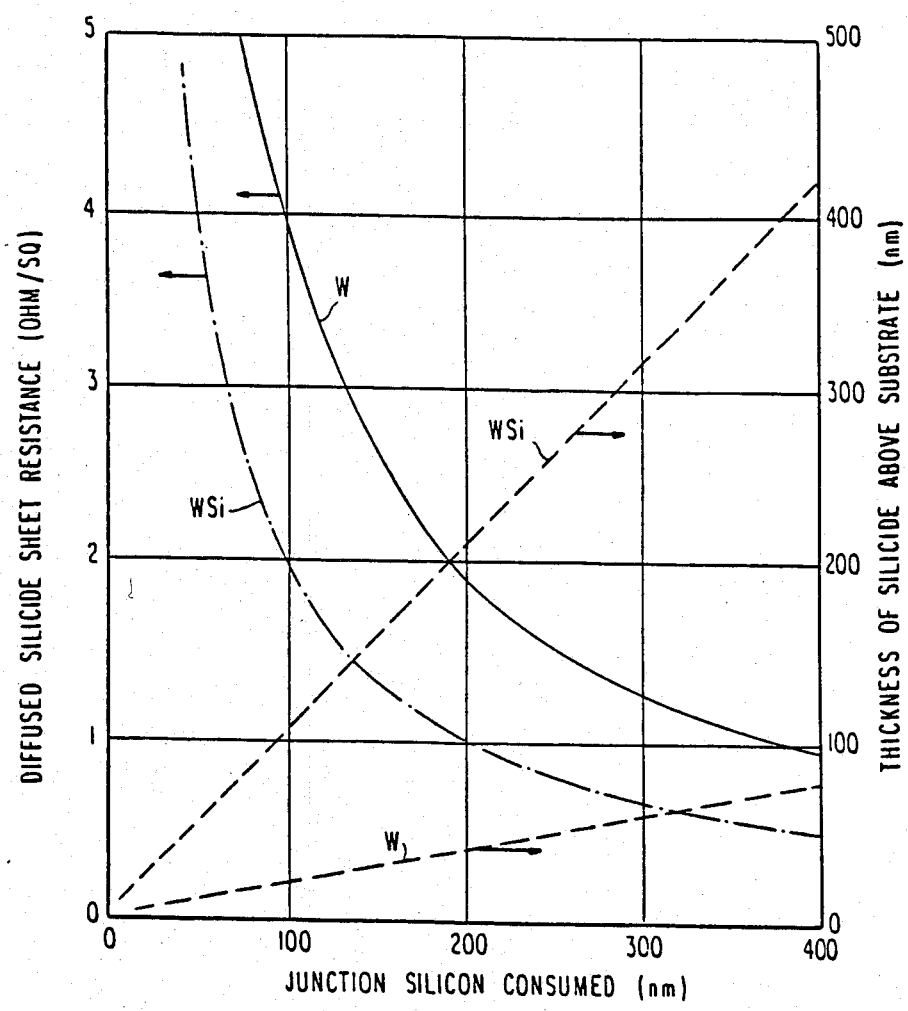

With reference to FIGS. 2 and 3, it is easily seen that for the same amount of junction silicon consumed a significantly lower sheet resistance is obtained with deposited alloys in accordance with the present invention as compared to that obtained with pure metal deposition. FIG. 2 compares pure titanium deposition with $TiSi_{1.0}$ deposition and FIG. 3 compares pure tungsten deposition with $WSi_{1.0}$ deposition.

In accordance with the present invention, a 100% decrease in achievable sheet resistance for the silicide junctions can be obtained as compared to the pure metal, for example, with $TiSi_{1.0}$ as compared to pure Ti.

Conversely, for comparable sheet resistances, only half of the required junction silicon consumed is observed with, e.g., $TiSi_{1.0}$ alloy films in accordance with the present invention as compared to that observed with pure Ti deposition, thereby providing a significantly higher margin of safety with respect to junction shorting. This permits shallower doped silicon junctions, an important factor with emerging VLSI technology.

A consequence of the fact that less junction silicon is consumed is that devices formed in accordance with the present invention do not illustrate non-ohmic behavior.

The following specific embodiments illustrate the benefits obtained per the present invention in more detail.

Case I—Titanium Metal Deposition—Conventional Salicide Process 50 nm of titanium (Ti) metal will react with 113.5 nm of junction silicon (Si) to form 118.5 nm of titanium silicide ($TiSi_2$). This should yield a sheet resistance, for the $TiSi_2$, of 1.26 ohms/square (based upon a specific resistivity for the $TiSi_2$ of 15 micro-ohm-cm). Under these conditions, the remaining silicon junction will be 113.5 nm. This would be the optimum result achievable using a conventional self-aligned silicide processes.

This amount of Ti can be used with pre-salicided doped Si junctions ranging down to 0.25 microns deep, based upon the following characteristics of optimized salicided junctions:

(1) the junction should provide ohmic contact between the salicided layer and remaining junction Si that is not consumed by the Ti;

(2) the junction should not exhibit excessive reverse bias diode leakage, normally exhibited by good non-salicided diodes of the same thickness as the salicided diodes and an equivalent dopant profile provide; and (3) the junction should exhibit normal forward bias characteristics.

It has been determined experimentally that up to one-half of the original junction Si can be consumed, during saliciding, and still yield the above junction diode properties.

Case II—$TiSi_x$ (x≃1) Alloy Deposit

The deposition of the above alloy (i.e., 50 nm of titanium, 56.75 nm of silicon) will result in the consumption of only one-half as much (i.e., 56.75 nm) junction Si as compared with Case I, yielding a junction only one-half as deep (i.e., 56.75 nm). The same silicide resistivity will be observed since the final $TiSi_2$ thickness is similar to that obtained with Ti metal deposition. This is an example of a most important benefit of the present invention, i.e., the ability, by use of the deposited alloy, to obtain more shallow junctions for a specified salicided junction resistance.

Case III—$TiSi_x$ Alloy Deposited For Fixed Junction Depth and Reduced Junction Resistance By doubling the amount of deposited titanium and silicon the same net junction depth will be produced as in Case I (i.e., 113.5 nm). However since the final silicide thickness is twice that obtained in Case I, the sheet resistance will be reduced by one-half (i.e., 0.63 ohms/sq.). Thus, the present invention also gives a designer the flexibility of selectively decreasing the sheet resistance without compromising shallow junctions. To achieve a 0.63 ohms/sq. sheet resistance in Case I, the final silicon junction would have to be 227 nm, i.e., double that achieved by utilizing the present invention.

The above examples are summarized in the following Table, along with similar cases for saliciding with cobalt (for Case II, x ≃0.75).

TABLE

Examples Comparing Metal Versus Alloy Deposition

| Case | Metal | Si/Me Ratio (1) | $MeSi_2$ Ratio (2) | Deposited Film Si/Me Ratio (3) | Deposited metal | Deposited silicon | Thickness (nm) Original junction thickness | Junction silicon consumed | Remaining junction silicon (4) | Salicided Junction Resistance ohms/sq (5) |
|---|---|---|---|---|---|---|---|---|---|---|
| I | Ti | 2.27 | 2.37 | 0 | 50 | 0 | 227 | 113.5 | 113.5 | 1.26 |
| II | Ti | 2.27 | 2.37 | 1.0 | 50 | 56.75 | 113.5 | 56.75 | 56.75 | 1.26 |
| III | Ti | 2.27 | 2.37 | 1.0 | 100 | 113.5 | 227 | 113.5 | 113.50 | 0.63 |
| I | Co | 3.66 | 3.56 | 0 | 31 | 0 | 227 | 113.5 | 113.5 | 1.54 |
| II | Co | 3.66 | 3.56 | 0.75 | 31 | 42.5 | 142 | 71 | 71 | 1.54 |
| III | Co | 3.66 | 3.56 | 0.75 | 50 | 68 | 230 | 115 | 115 | 0.96 |

(1) Volume (film thickness) ratio of metal to silicon needed to form the final $MeSi_2$ silicide
(2) Final $MeSi_2$ silicide volume (film thickness) ratio to deposited metal volume (thickness)
(3) $MeSi_x$ ratio for maximum silicon that will yield a salicide reaction as per the invention
(4) Based upon experimentally determined rule that no more than one-half of the original junction is consumed for salicide formation
(5) Resistivity of $TiS_2$ = 15 micro-ohm-cm; $CoSi_2$ = 17 micro-ohm-cm.

Having thus described general aspects of the invention, the following currently preferred best modes of practicing the invention are offered.

EXAMPLE 1

Silicon dioxide was grown in a conventional manner on a conventional $p^-$-type silicon substrate, and then polysilicon was deposited thereon using conventional techniques. Following polysilicon deposition, photolithographic etching was conducted in a conventional manner to define the polysilicon gate electrode. This in turn defines the source and drain regions. The source and drain regions were then doped with arsenic to a doping profile level of $10^{20}/cm^2$ at the silicon surface with a junction depth of 300 nm, and the remaining silicon dioxide was then removed.

Processing as above is conventional in the art.

After the above procedure, the intermediate device was introduced into a vacuum evaporation furnace which was maintained at a pressure of $10^{-6}$ Torr. Using electron beam evaporation, a source of pure titanium and a source of pure silicon were evaporated to form a titanium-silicon alloy over the complete surface of the intermediate device using the following conditions: Ti evaporation rate=2 Angstroms/sec., Si evaporation rate=2.27 Angstroms/sec.

The alloy had the composition $TiSi_{1.0}$; the thickness of the $TiSi_{1.0}$ was 106.75 nm (50 nm Ti plus 56.75 nm Si).

Following deposition of the TiSi$_{1.0}$, the intermediate device was introduced into a furnace, whereafter the inert gas forming gas containing 10 vol % H$_2$ plus 90 vol % N$_2$ was flowed through the furnace; the furnace temperature was raised to 650° C. and annealing was conducted at that temperature for 30 minutes.

The intermediate device was removed from the furnace and then etched in an etchant comprising (all parts are by volume) 1 part NH$_4$OH, 1 part H$_2$O$_2$ (30 vol %) and 1 part H$_2$O, heated to 75° C. Etching was conducted for 5 minutes at the above conditions. Etching was otherwise at ambient conditions.

The intermediate device was then removed from the etch bath.

The unreacted TiSi$_{1.0}$ had been completely removed over the silicon dioxide areas, and yet the reacted TiSi$_2$ remained over the source and drain regions and over the polysilicon gate electrode.

The resulting junction depth was 56.75 nm.

EXAMPLE 2

The procedure of Example 1 was followed except for evaporating cobalt and silicon to yield as deposited CoSi$_{0.75}$ and annealing was at 650° C. The etch bath used was 1 part HCl, 1 part H$_2$O$_2$, and 1 part H$_2$O heated to 75° C.

Similar results were obtained.

While there have been described what are at present considered to be the preferred embodiments of this invention, it will be obvious to those skilled in the art that various changes and modifications can be made therein without departing from the invention, and it is, therefore, intended to cover all such changes and modifications as fall within the true spirit and scope of the invention.

What is claimed is:

1. A process of forming a patterned silicide layer overlying a processed semiconductor substrate, the substrate having insulator regions and insulator-free regions on an exposed surface thereof, comprising the steps of:
    co-depositing silicon and a refractory metal on the exposed surface of the substrate to form a metal rich silicide of the formula MSi$_x$ thereon, wherein $0.25 \leq x \leq 1.0$;
    annealing the metal rich silicide such that it reacts with the underlying insulator-free regions to form a reacted silicide without reacting with the underlying insulator regions; and
    exposing the substrate to a concentrated basic peroxide etchant which removes the unreacted portions of said metal rich silicide without removing said reacted silicide.

2. The process of claim 1, wherein said refractory metal is selected from the group consisting of titanium, zirconium, tungsten and molybdenum.

3. The process of claim 1, wherein said refractory metal is titanium.

4. The process of claim 1, wherein said insulator-free regions comprise monocrystalline or polycrystalline silicon, and wherein said insulator regions comprise silicon dioxide.

5. The process of claim 1, wherein said etchant has a pH of about 11 to about 12.

6. The process of claim 1, wherein said etchant consists essentially of a 1:1:1 volume solution of ammonium hydroxide, hydrogen peroxide and water.

7. A process of forming a patterned silicide layer overlying a processed semiconductor substrate, the substrate having insulator regions and insulator-free regions on an exposed surface thereof, comprising the steps of:
    co-depositing silicon and a refractory metal on the exposed surface of the substrate to form a metal rich silicide of the formula MSi$_x$ thereon, $0.25 \leq x \leq 0.75$;
    annealing the metal rich silicide such that it reacts with the underlying insulator-free regions to form a reacted silicide without reacting with the underlying insulator regions; and
    exposing the substrate to a concentrated acidic peroxide etchant which removes the unreacted portions of said metal rich silicide without removing said reacted silicide.

8. The process of claim 7, wherein said refractory metal is selected from the group consisting of cobalt, vanadium and nickel.

9. The process of claim 7, wherein said insulator-free regions comprise monocrystalline or polycrystalline silicon, and wherein said insulator regions comprise silicon dioxide.

10. The process of claim 7, wherein said etchant has a pH of about 1 to about 2.

11. The process of claim 2, wherein said etchant consists essentially of a 1:1:1 volume solution of a member selected from the group consisting of hydrochloric acid and sulfuric acid, in combination with hydrogen peroxide and water.

* * * * *